United States Patent
Ran et al.

(10) Patent No.: US 11,914,006 B2
(45) Date of Patent: Feb. 27, 2024

(54) DRIVING CIRCUIT, MAGNETIC SENSING CIRCUIT, AND ELECTRICAL DEVICE

(71) Applicant: BEIANG AIR TECH LTD., Suzhou (CN)

(72) Inventors: Hongyu Ran, Suzhou (CN); Yan Zhang, Suzhou (CN); Yigang Liu, Suzhou (CN); Hongqiang Li, Suzhou (CN); Mingming Wei, Suzhou (CN)

(73) Assignee: BEIANG AIR TECH LTD., Suzhou (CN)

( * ) Notice: Subject to any disclaimer, the term of this patent is extended or adjusted under 35 U.S.C. 154(b) by 0 days.

(21) Appl. No.: 17/794,604

(22) PCT Filed: Nov. 12, 2021

(86) PCT No.: PCT/CN2021/130293
§ 371 (c)(1),
(2) Date: Jul. 21, 2022

(87) PCT Pub. No.: WO2022/188452
PCT Pub. Date: Sep. 15, 2022

(65) Prior Publication Data
US 2023/0408603 A1 Dec. 21, 2023

(30) Foreign Application Priority Data

Mar. 12, 2021 (CN) .......................... 202110268918.4
Mar. 19, 2021 (CN) .......................... 202110295266.3

(51) Int. Cl.
*G01R 33/00* (2006.01)
*G09G 3/14* (2006.01)
(Continued)

(52) U.S. Cl.
CPC ........... *G01R 33/0023* (2013.01); *G09G 3/14* (2013.01); *G01R 33/0058* (2013.01); *G09F 9/30* (2013.01);
(Continued)

(58) Field of Classification Search
CPC .. G01R 33/0023; G01R 33/0058; G09G 3/14; G09G 2310/0291; G09G 3/32;
(Continued)

(56) References Cited

U.S. PATENT DOCUMENTS

| 5,370,015 | A | * | 12/1994 | Moscatelli | .............. F16H 59/08 324/207.2 |
| 5,621,317 | A | * | 4/1997 | Wozniak | ................... G01B 7/30 324/207.13 |
| 2003/0057886 | A1 | * | 3/2003 | Lys | ....................... F21V 21/002 315/324 |

FOREIGN PATENT DOCUMENTS

| CN | 102821521 A | 12/2012 |
| CN | 203057657 U | 7/2013 |

(Continued)

OTHER PUBLICATIONS

Maxim, Data Sheet for MAX6950-MAX6951 Serially interfaced LED Display Drivers, Mar. 2005, pp. 1-19 (Year: 2005).*

*Primary Examiner* — Douglas M Wilson
(74) *Attorney, Agent, or Firm* — SZDC Law PC

(57) ABSTRACT

The application provides a driving circuit. The circuit includes: a segment display, including a plurality of light-emitting units; a controller, configured to generate a control instruction for the segment display according to a configuration signal; a digital driver, connected to the controller, and configured to generate a pulse driving signal according to the control instruction from the controller; and an amplification circuit, with one end being connected to the digital driver and the other end being connected to the plurality of (Continued)

light-emitting units of the segment display. The application also provides a magnetic sensing circuit and an electrical device. The magnetic sensing circuit includes a magnetic sensor, a sensing selection circuit, and a result representation circuit. A plurality of magnetic sensors are provided, and at least some of the plurality of magnetic sensors are capable of being connected to the sensing selection circuit by a sensing output terminal.

15 Claims, 9 Drawing Sheets

(51) Int. Cl.
G09G 3/32 (2016.01)
G09F 13/22 (2006.01)
G09F 9/30 (2006.01)
G09F 9/302 (2006.01)
H03K 17/687 (2006.01)

(52) U.S. Cl.
CPC ...... G09F 9/3023 (2013.01); G09F 2013/222 (2013.01); G09G 3/32 (2013.01); G09G 2310/02 (2013.01); G09G 2310/0264 (2013.01); G09G 2310/0291 (2013.01); H03K 17/687 (2013.01)

(58) Field of Classification Search
CPC ....... G09G 2310/02; G09G 2310/0264; G09G 2310/0267; H03K 17/687; G05B 2219/23139; H10K 59/10; H10K 59/19; G09F 9/30; G09F 9/3023; G09F 2013/222

See application file for complete search history.

(56) References Cited

FOREIGN PATENT DOCUMENTS

| CN | 204388251 U | | 6/2015 |
| CN | 204478309 U | | 7/2015 |
| CN | 207113053 U | | 3/2018 |
| CN | 108806569 A | * | 11/2018 |
| CN | 209823761 U | | 12/2019 |
| CN | 113053298 A | | 6/2021 |
| CN | 113162594 A | | 7/2021 |
| CN | 214256274 U | | 9/2021 |

* cited by examiner

DRIVING CIRCUIT, MAGNETIC SENSING CIRCUIT, AND ELECTRICAL DEVICE

CROSS-REFERENCE TO RELATED APPLICATION

This patent application is the National Stage Application of PCT/CN2021/130293, filed on Nov. 12, 2021, which claims priority to Chinese patent application No. 202110268918.4 filed on Mar. 12, 2021 and Chinese patent application No. 202110295266.3 filed on Mar. 19, 2021, the disclosure of which is hereby incorporated by reference in their entirety.

FIELD OF THE INVENTION

The present invention relates to the field of circuit technologies, and specifically to a driving circuit. In some embodiments, the present invention relates to the field of magnetic sensing technologies, and specifically to a magnetic sensing circuit and an electrical device.

DESCRIPTION OF THE RELATED ART

Light-emitting diodes (LEDs) have the advantages of energy saving and environmental protection and develop rapidly in the application to electronic products. Due to the wide application of LEDs, the growth of the industry is widely noted. In modern society, LEDs can be seen everywhere. LEDs can be used in household ceiling lights, advertising displays, traffic display signals, and the like. Especially in the home appliance industry, to design stable and reliable driving circuits, designers have made a variety of driving circuits.

LED lighting products are becoming increasingly popular. The service life of an LED lamp is directly related to a driving circuit of the LED lamp. According to different sources of driving power, driving circuits of LEDs may be divided into two categories. One category is AC/DC conversion, and energy comes from alternating current. The other category is DC/DC conversion, and energy comes from a dry battery, a rechargeable battery, a storage battery, or the like. Driving power of an LED is actually a power converter that converts power supply into a specific voltage and a specific current to drive the LED to emit light. Because an LED has a very steep forward voltage-current curve, that is, has a very small forward dynamic resistance, it is relatively difficult to normally and stably supply power to the LED. A voltage source cannot be used to directly supply power to the LED like an ordinary incandescent lamp because a slight increase in voltage may cause an increase in a current to burn out the LED.

In addition, magnetic induction technology has been used in many electrical devices such as computers, automobiles, induction cookers, microwave ovens, household appliances, and power tools. It can be said that magnetic induction technology fills all aspects of life. An air purifier is used as an example. The magnetic induction technology is used in many parts of the air purifier. For example, after a detachable part of the air purifier is detached for cleaning, the air purifier needs to detect the successful installation of the detachable part before the air purifier can run again. In another example, the air purifier needs to detect whether a filter is appropriately installed.

In the prior art, the magnetic induction technology mainly relies on the arrangement of a micro switch for implementation. An air purifier is used as an example. A micro switch may be arranged between a detachable part (a filter, a collector, or the like) and a main part. After the detachable part is detached for cleaning, the micro switch is in an open state. After the detachable part is successfully installed, the micro switch is in a closed state to implement the detection of a magnetic member. However, the service life of the micro switch is affected by an operating current, an environmental humidity, a switching frequency, and the like. Moreover, one micro switch circuit needs to be correspondingly arranged for each detachable part. As a result, the manufacturing cost and the maintenance cost of the air purifier are increased.

SUMMARY OF THE INVENTION

An object of the present application is to provide a driving circuit. A digital driving mode is used to control the driving of a segment display, thereby reducing the complexity of a driving circuit for the segment display and improving the driving efficiency of the segment display.

A first aspect of embodiments of the present application provides a driving circuit, including: a segment display, including a plurality of light-emitting units; a controller, configured to generate a control instruction for the segment display according to a configuration signal; a digital driver, connected to the controller, and configured to generate a pulse driving signal according to the control instruction generated by the controller; and an amplification circuit, with one end being connected to the digital driver and the other end being connected to the plurality of light-emitting units of the segment display, and configured to amplify the pulse driving signal, where the amplified pulse driving signal is used for driving the light-emitting units of the segment display to emit light.

In an embodiment, there are a plurality of segment displays, and each segment display includes a plurality of light-emitting units.

In an embodiment, the driving circuit further includes a gating circuit. The gating circuit includes a plurality of gating switches, one end of each gating switch is connected to the digital driver, and the other end is connected to one segment display.

In an embodiment, the control instruction further includes a gating instruction, and the digital driver is further configured to generate a gating pulse signal according to the gating instruction, to drive a target gating switch of a selected target segment display to be turned on.

In an embodiment, the gating switch includes: a first triode and a second triode, where the first triode is connected to the digital driver, and the second triode is connected to one segment display; and a first noise reduction circuit, connected between the first triode and the second triode, and configured to reduce a noise signal of the gating switch.

In an embodiment, the amplification circuit includes a plurality of amplifiers, where one end of each amplifier is connected to the digital driver, and the other end is connected to one light-emitting unit of the target segment display.

In an embodiment, the amplifier includes: a third triode and a fourth triode, where the third triode is connected to the digital driver, and the fourth triode is connected to one light-emitting unit of the target segment display; and a second noise reduction circuit, connected between the third triode and the fourth triode, and configured to reduce a noise signal of the amplifier.

In an embodiment, the driving circuit further includes a shunt circuit having a plurality of shunt resistors, where one end of each shunt resistor is connected to one amplifier, and the other end is connected to one light-emitting unit of the target segment display.

In an embodiment, the driving circuit further includes a third noise reduction circuit, connected between the digital driver and the gating circuit, and configured to reduce a noise signal of the gating circuit.

In an embodiment, the driving circuit further includes a fourth noise reduction circuit, connected between the digital driver and the amplifier, and configured to reduce a noise signal of the amplifier.

In the driving circuit of the present application, a digital driver supplies a driving signal to a segment display, an amplification circuit amplifies the driving signal, and then the amplified driving signal drives a light-emitting unit of the segment display to emit light, so that a digital driving mode is used to control the driving of the segment display, thereby reducing the complexity of a driving circuit for the segment display and improving the driving efficiency of the segment display.

In a preferred embodiment, the magnetic sensing circuit provided in the embodiments of the present application includes a magnetic sensor, a sensing selection circuit, and a result representation circuit, where a plurality of magnetic sensors are provided, and at least some magnetic sensors in the plurality of magnetic sensors are capable of being connected to the sensing selection circuit by a sensing output terminal to send a magnetic sensing result to the sensing selection circuit;

the sensing selection circuit is configured to obtain a result representation signal according to the magnetic sensing result, and send the result representation signal to the result representation circuit; and the result representation circuit is configured to display a sensing notification according to the result representation signal.

With reference to the first aspect, the present application further provides a first optional embodiment of the first aspect. The sensing selection circuit includes a logic chip, at least some magnetic sensors in the plurality of magnetic sensors are capable of being connected to a signal input terminal of the logic chip by the sensing output terminal, and a signal output terminal of the logic chip is used as an output terminal of the sensing selection circuit to be connected to an input terminal of the result representation circuit.

With reference to the first optional embodiment of the first aspect, the present application further provide a second optional embodiment of the first aspect. The sensing selection circuit further includes a connecting resistor, and at least some magnetic sensors in the plurality of magnetic sensors are capable of being connected to a corresponding connecting resistor by the sensing output terminal to be connected to the signal input terminal of the logic chip by the corresponding connecting resistor.

With reference to the first optional embodiment of the first aspect, the present application further provide a third optional embodiment of the first aspect. The sensing selection circuit further includes a current-limiting resistor, the signal output terminal of the logic chip is connected to one end of the current-limiting resistor, and the other end of the current-limiting resistor is used as an output terminal of the sensing selection circuit to be connected to the input terminal of the result representation circuit.

With reference to any optional embodiment in the first optional embodiment to the third optional embodiment of the first aspect, the present application further provide a fourth optional embodiment of the first aspect. The result representation circuit includes a switch device, a first driving circuit, and a first load;

a control terminal of the switch device is connected to the output terminal of the sensing selection circuit, and is configured to control an open/closed state by using the result representation signal, and when the switch device is in the closed state, a generated driving signal is sent to the first driving circuit; and the first driving circuit is configured to control the first load under the control of the driving signal to start and run, so that the first load can use a running result as the sensing notification.

With reference to the first optional embodiment of the first aspect, the present application further provides a fifth optional embodiment of the first aspect. The sensing selection circuit further includes a first detection circuit, a signal input terminal of the first detection circuit is connected to the signal output terminal of the logic chip, and a signal output terminal of the first detection circuit is used as the output terminal of the sensing selection circuit to be connected to the input terminal of the result representation circuit.

With reference to the first aspect, the present application further provides a sixth optional embodiment of the first aspect. The sensing selection circuit includes a decoder and a second detection circuit;

at least some magnetic sensors in the plurality of magnetic sensors are capable of being connected to a signal input terminal of the decoder by the sensing output terminal, and a signal output terminal of the decoder is connected to a signal input terminal of the second detection circuit; and a signal output terminal of the second detection circuit is used as an output terminal of the sensing selection circuit to be connected to an input terminal of the result representation circuit.

With reference to the fifth or sixth optional embodiment of the first aspect, the present application further provides a seventh optional embodiment of the first aspect. The result representation circuit includes a display, and the display is connected to the output terminal of the sensing selection circuit.

With reference to the fifth or sixth optional embodiment of the first aspect, the present application further provides an eighth optional embodiment of the first aspect. The result representation circuit includes a second driving circuit and a second load; and a control terminal of the second driving circuit is connected to the output terminal of the sensing selection circuit, and is configured to control the second load by using the result representation signal to start and run, so that the second load can use a running result as the sensing notification.

According to a second aspect, the present application further provide an electrical device, including the magnetic sensing circuit provided in the first aspect or any optional embodiment of the first aspect.

The magnetic sensing circuit provided in the embodiments of the present application includes a magnetic sensor, a sensing selection circuit, and a result representation circuit. A plurality of magnetic sensors are provided, and at least some magnetic sensors in the plurality of magnetic sensors are capable of being connected to the sensing selection circuit by a sensing output terminal to send a magnetic sensing result to the sensing selection circuit. The sensing selection circuit is configured to obtain a result representation signal according to the magnetic sensing result, and send the result representation signal to the result representation circuit. The result representation circuit is configured to display a sensing notification according to the result representation signal. The magnetic sensing circuit provided in the embodiments of the present application is implemented by using a magnetic sensor. The service life of the magnetic sensing circuit is not affected by factors such as an operating current, an environmental humidity, and a switching frequency. In addition, only one magnetic sensing circuit may be arranged in one same electrical device, and then at least some magnetic sensors are selected from a plurality of magnetic sensors according to an actual sensing requirement to be connected to a sensing selection circuit by a sensing output terminal to implement an application. Therefore, the design and development costs of the magnetic sensing circuit are reduced, and eventually the manufacturing cost and maintenance cost of the electrical device are reduced.

Preferably, in the magnetic sensing circuit provided in the embodiments of the present application, the sensing selection circuit can be arranged in many manners and can adapt to different sensing requirements, thereby improving the compatibility and applicable range of the magnetic sensing circuit.

The electrical device provided in the embodiments of the present application has the same beneficial effects as the foregoing magnetic sensing circuit. Details are not described herein.

BRIEF DESCRIPTION OF THE DRAWINGS

To describe the technical solutions in the embodiments of the present application more clearly, the following briefly introduces the accompanying drawings required for the embodiments of the present application. Apparently, the following accompanying drawings show merely some embodiments of the present application and therefore should not be considered as a limitation to the scope. A person of ordinary skill in the art may still derive other related drawings from these accompanying drawings without creative efforts.

REFERENCE NUMERALS

1—driving circuit; 10—controller; 11—processor; 12—power interface; 13—communication interface; 20—digital driver; 30—amplification circuit; 31—amplifier; 311—third triode; 312—fourth triode; 313—second noise reduction circuit; 40—segment display; 50—gating circuit; 51—gating switch; 511—first triode; 512—second triode; 513—first noise reduction circuit; 60—shunt resistor; 70—third noise reduction circuit; 80—fourth noise reduction circuit; 106—bus; 100—magnetic sensing circuit; 110—magnetic sensor; 120—sensing selection circuit; 121—logic chip; 122—connecting resistor; R5—current-limiting resistor; 124—first detection circuit; 125—decoder; 126—second detection circuit; 130—result representation circuit; 131—switch device; 132—first driving circuit; 133—first load; 134—display; 135—second driving circuit; 136—second load; 200—air purifier; 210—filter; 220—collector; and 230—main part.

DETAILED DESCRIPTION OF THE PREFERRED EMBODIMENTS

The following describes the technical solutions in embodiments of the present application with reference to the accompanying drawings in embodiments of the present application. In the description of the present application, the terms "first", "second", and the like are only used only for distinguishing between descriptions but are not intended to indicate or imply relative importance.

Figure 1:
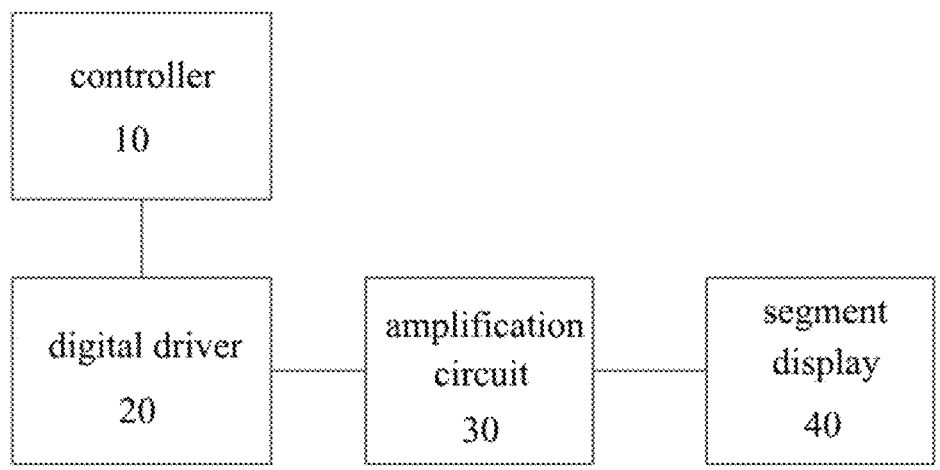
FIG. 1 is a schematic structural diagram of a driving circuit according to an embodiment of the present application.

As shown in FIG. 1, this embodiment provides a driving circuit 1, including a controller 10, a digital driver 20, an amplification circuit 30, and a segment display 40.

The segment display 40 includes a plurality of light-emitting units. The segment display 40 may be an LED segment display 40. The light-emitting units may be LED light-emitting units. For example, an LED 8-segment display 40 is used.

The controller 10 is configured to generate a control instruction for the segment display 40 according to a configuration signal. The controller 10 may include a processor 11, a power interface 12, and a communication interface 13. The controller 10 is electrically connected to a power device by a power interface. A user may input a configuration signal through the communication interface 13. The processor 11 generates a control instruction for each light-emitting unit of the segment display 40 according to the configuration signal.

The digital driver 20 is connected to the controller 10, and is configured to generate a pulse driving signal according to the control instruction of the controller 10. The digital driver 20 may be connected to the controller 10 by an inter-integrated circuit (I2C) bus. The digital driver 20 may be implemented by using a TM1639 chip, and may receive different control instructions generated by the controller 10, and generate corresponding pulse driving signals according to the different control instructions.

The amplification circuit 30 has one end connected to the digital driver 20 and the other end connected to the plurality of light-emitting units of the segment display 40, and is configured to amplify the pulse driving signal. The amplified pulse driving signal is used for driving the light-emitting units of the segment display 40 to emit light. The amplification circuit 30 may be implemented by cascading triodes. The amplification circuit 30 amplifies the power of the pulse driving signals generated by the digital driver 20, to increase the driving power of the segment display 40, thereby simplifying the complex hardware design for conventional LED power driving manners and improving the stability of the driving circuit 1.

Figure 2:
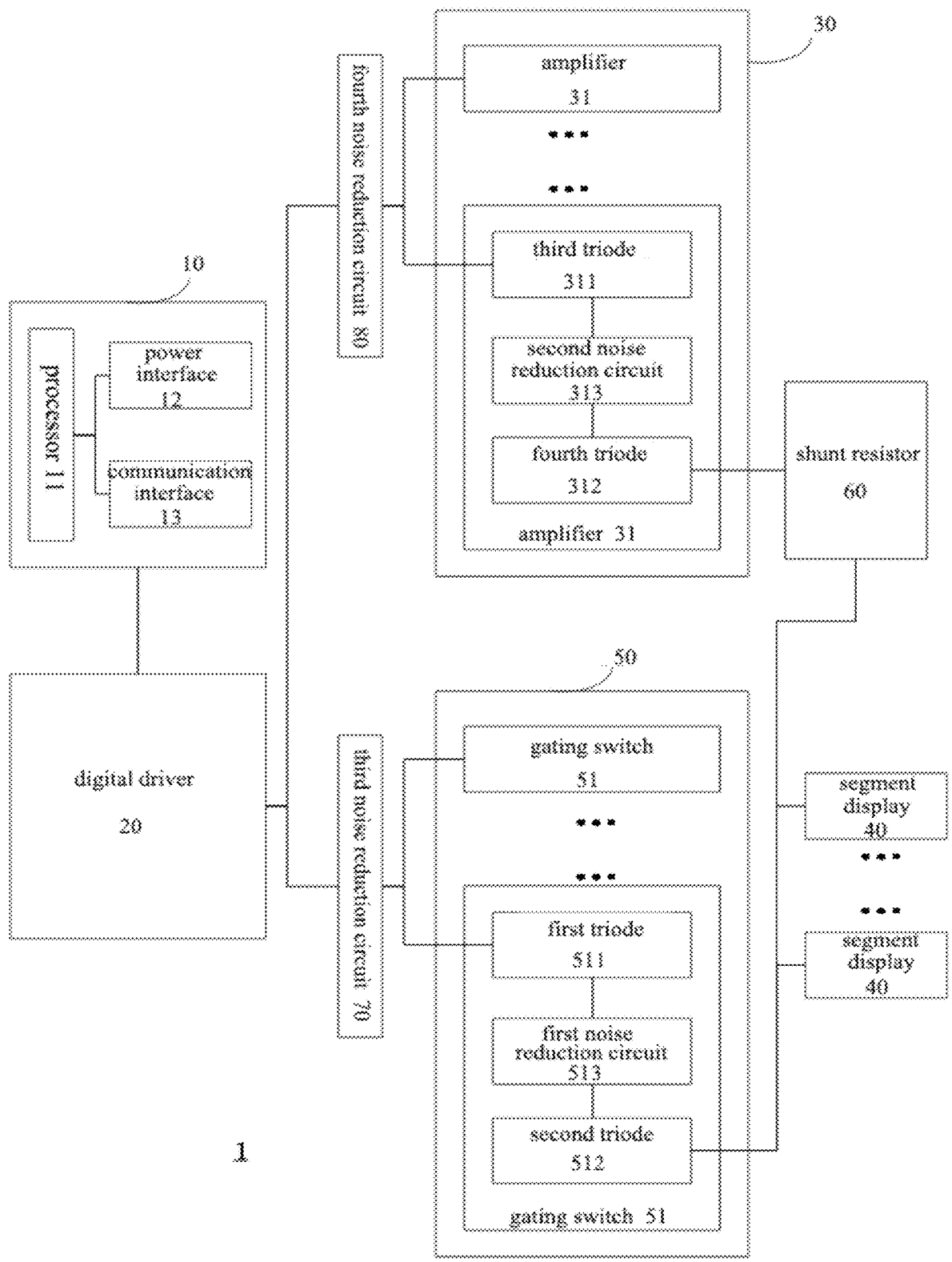
FIG. 2 is a schematic structural diagram of a driving circuit according to an embodiment of the present application.

As shown in FIG. 2, this embodiment provides a driving circuit 1. There are a plurality of segment displays 40. Each segment display 40 includes a plurality of light-emitting units.

In an embodiment, the driving circuit 1 further includes a gating circuit 50. The gating circuit 50 includes a plurality of gating switches 51. One end of each gating switch 51 is connected to the digital driver 20, and the other end is connected to one segment display 40.

In an embodiment, the control instruction further includes a gating instruction, and the digital driver 20 is further configured to generate a gating pulse signal according to the gating instruction, to drive a target gating switch 51 of a selected target segment display 40 to be turned on. The digital driver 20 generates a bit selection signal according to the gating instruction. The bit selection signal designates the target segment display 40 to operate. The target gating switch 51 connected to the target segment display 40 receives the bit selection signal and is closed, to connect the circuit in which the target segment display 40 is located, thereby driving the target segment display 40 to operate.

In an embodiment, the gating switch 51 includes a first triode 511, a second triode 512, and a first noise reduction circuit 513. The first triode 511 is connected to the digital driver 20. The second triode 512 is connected to one segment display 40. The first noise reduction circuit 513 is connected between the first triode 511 and the second triode 512, and is configured to reduce a noise signal of the gating switch 51. The first noise reduction circuit 513 may be formed by a voltage-dividing resistor. The voltage-dividing resistor may supply a particular bias voltage to the second triode 512, to prevent misoperation of the second triode 512 generated under the impact of a noise signal.

In an embodiment, the amplification circuit 30 includes a plurality of amplifiers 31. One end of each amplifier 31 is connected to the digital driver 20. The other end is connected to one light-emitting unit of the target segment display 40. That is, one amplification circuit 30 is separately disposed for each light-emitting unit of the segment display 40, to ensure the overall stability of the light emission of the segment display 40.

In an embodiment, each amplifier 31 may include a third triode 311, a fourth triode 312, and a second noise reduction circuit 313. The third triode 311 is connected to the digital driver 20. The fourth triode 312 is connected to one light-emitting unit of the target segment display 40. The second noise reduction circuit 313 is connected between the third triode 311 and the fourth triode 312, and is configured to reduce a noise signal of the amplifier 31.

In an embodiment, the driving circuit further includes a shunt circuit, including a plurality of shunt resistors 60. One end of each shunt resistor 60 is connected to one amplifier 31, and the other end is connected to one light-emitting unit of the target segment display 40.

In an embodiment, the driving circuit further includes a third noise reduction circuit 70, connected between the digital driver 20 and the gating circuit 50, and configured to reduce a noise signal of the gating circuit 50.

In an embodiment, the driving circuit further includes a fourth noise reduction circuit 80, connected between the digital driver 20 and the amplifier 31, and configured to reduce a noise signal of the amplifier 31.

Figure 3A:
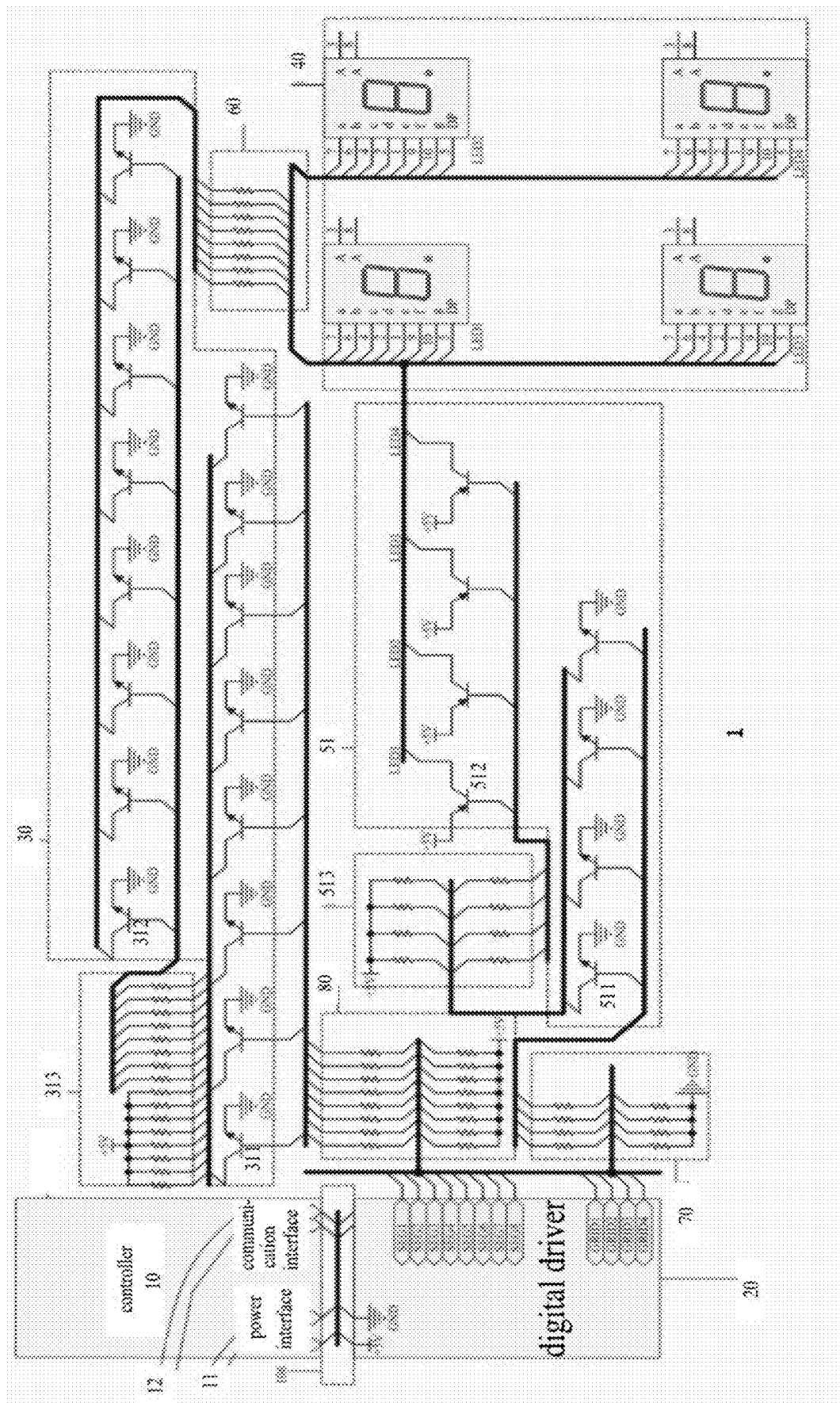
FIG. 3A is a schematic structural diagram of a driving circuit according to an embodiment of the present application.

As shown in FIG. 3A, this embodiment provides a driving circuit 1. The driving of four LED segment displays 40 is used as an example. Therefore, in the gating circuit 50, one gating switch 51 is provided for each segment display 40, and a total of four gating switches 51 are provided. Each LED segment display 40 includes eight light-emitting segments (light-emitting units). Therefore, in the amplification circuit 30, one amplifier 31 is provided for each light-emitting segment.

Figure 3B:
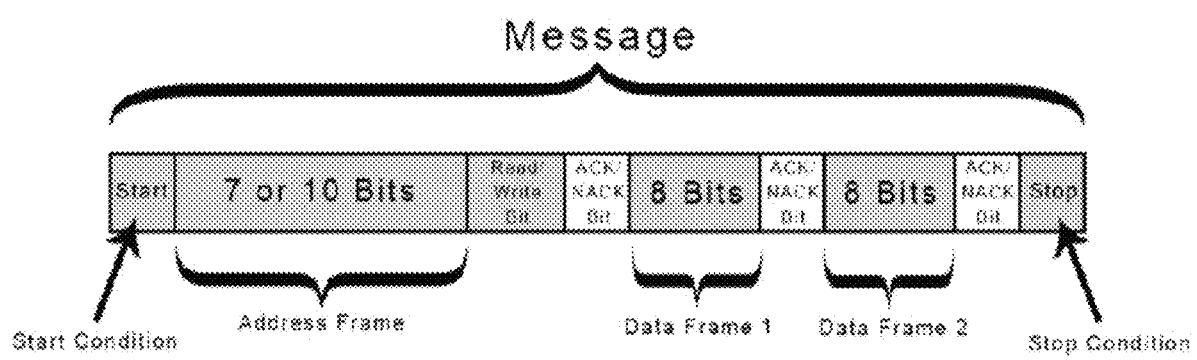
FIG. 3B is a schematic structural diagram of a message according to an embodiment of the present application.

The controller 10 may include a communication interface 13. The communication interface 13 performs data communication with the digital driver 20 through an I2C bus 106. The I2C bus 106 is a serial bus 106 formed by a data line SDA and a clock line SCL, and may send and receive data. A hardware interface optimized in this way only needs to send a corresponding control instruction to turn on a corresponding light-emitting segment of the LED segment display 40. The communication interface 13 may connect the data line SDA and the clock line SCL of I2C. SCL represents a clock signal, and SDA represents a data signal. During the use of the I2C bus 106, data is converted into messages, and then data messages are decomposed into data frames. Each message has one address frame including a binary address of a slave station and one or more data frames including data being transmitted. As shown in FIG. 3B, the message further includes a start condition and a stop condition between data frames, a read/write bit, and an ACK/NACK bit.

In an embodiment, the controller 10 may include a power interface 12 (a power positive electrode and a power negative electrode). The power interface 12 may be used to connect power supplies VCC and GND. VCC is a power supply voltage of the controller 10 and supplies energy and power to the controller 10. GND is a system grounding line.

In an embodiment, the digital controller 10 may be a TM1639 chip, is connected to the controller 10 by the bus 106, performs bidirectional communication with the controller 10, and sends a corresponding driving signal by the controller 10 to control on and off of an external LED segment display 40. The TM1639 chip is based on the protocol of the I2C bus 106 and has advantages such as reliable quality, adequate stability, and a strong anti-interference capability.

In an embodiment, the gating circuit 50 includes a total of four gating switches 51. Each gating switch 51 includes two triodes. The triode may be a bipolar junction transistor (BJT) or may be a field effect transistor. In this embodiment, a BJT is used as an example. The first triode 511 may be an NPN-type BJT, and the second triode 512 may be a PNP-type BJT. To obtain a higher equivalent current, a digital signal drives a bit selection signal GRID1, a bit selection signal GRID2, a bit selection signal GRID3, and a bit selection signal GRID4 of the TM1639 chip, which are separately divided and biased by the third noise reduction circuit 70 formed by two resistors, to supply a reference voltage to a composite transistor formed by the two triodes in the gating switch 51. The triodes of the gating switch 51 may generate a composite high-current amplification coefficient, to enhance the current for driving the LED segment display 40.

In an embodiment, for a first noise reduction resistor and a third noise reduction resistor, a bias voltage is mainly set through the voltage division of the transistors, to avoid the distortion of signals, thereby preventing misoperation of the triode generated under the impact of a noise signal. In the triode 31, the triode has a junction voltage (or referred to as a starting voltage, for example, 0.2 V to 0.3 V for germanium, and 0.7 V for silicon) between a base (b) and an emitter (e). If a bias circuit (noise reduction circuit) is not disposed for the amplifier 31 (silicon), when a signal less than 0.7 V is inputted between e and b, the base (b) and the emitter (e) cannot be connected. That is, there is no Ib (Ib=0). There is no IC with the absence of Ib (that is, there is no starting current when the starting voltage is insufficient). In this case, the amplifier 31 is in a cut-off area and cannot amplify a current. The noise reduction circuits are used for setting a bias voltage.

In an embodiment, the amplification circuit 30 includes eight amplifiers 31. Each amplifier 31 includes a first triode 511 and a second triode 512. The triode may be a BJT or may be a field effect transistor. In this embodiment, a BJT is used as an example. The third triode 311 may be an NPN-type BJT, the fourth triode 312 may be an NPN-type BJT, and the third triode 311 and the fourth triode 312 form an inverting circuit. The TM1639 chip of the digital driver 20 generates a segment selection signal according to a control instruction of the controller 10. The segment selection signal passes through the voltage-dividing resistor of the fourth triode 80 to supply a bias voltage to a base of the third triode 311. Then the segment selection signal passes through the fourth triode 312 to be inverted again and form a loop with the bit selection signal generated by the TM1639 chip, to drive an anode segment display 40. That is, the bit selection signal designates that the target segment display 40 is to be turned on, and the target gating switch 51 is turned on, to connect the circuit in which the target segment display 40 is located. The segment selection signal turns on the amplifier 31, to further use an amplified pulse driving signal to drive on and off of each light-emitting segment of the target segment display 40.

For the operating principle of a second noise reduction resistor and a fourth noise reduction resistor, reference may be made to the principle of the first noise reduction circuit 513 and the third noise reduction circuit 70.

In an embodiment, to prevent the driving current from becoming excessively large to burn out the segment display 40, serially connected shunt resistors 60 may be added to a driving circuit, to reduce the driving current to fall within an appropriate range.

The operating principle of the foregoing driving circuit 1 is as follows:

1. In a normal operating mode, the controller 10 notifies the TM1639 chip of the digital driver 20 according to a configuration signal to enter an operating mode, and the I2C bus 106 is used to send a corresponding control instruction to the digital driver 20.

2. The TM1639 chip generates a bit selection signal according to a gating instruction, and a voltage-dividing resistor is disposed to supply a bias voltage to a composite power triode of the gating switch 51. The composite power triode through which the bit selection signal passes greatly increase a current coefficient, thereby improving the driving capability of the driving circuit 1. The TM1639 chip generates a segment selection signal according to a control instruction, and a voltage-dividing resistor is disposed to supply a bias voltage to the third triode of the amplifier 31. After passing through the fourth triode 312, the segment selection signal is inverted again, to further form a loop with the bit selection signal of the TM1639 chip, thereby driving the anode segment display 40.

In this embodiment, the bus 106 includes two lines. One is a serial data line SDA, and the other is a serial clock line SCL. Bidirectional transfer is performed between chips, and the maximum transfer rate may be 100 kbps. Other controlled circuits are all connected in parallel to the bus 106. Each controlled circuit has a unique address, thereby greatly reducing the hardware circuit costs of the driving circuit 1.

Figure 4:
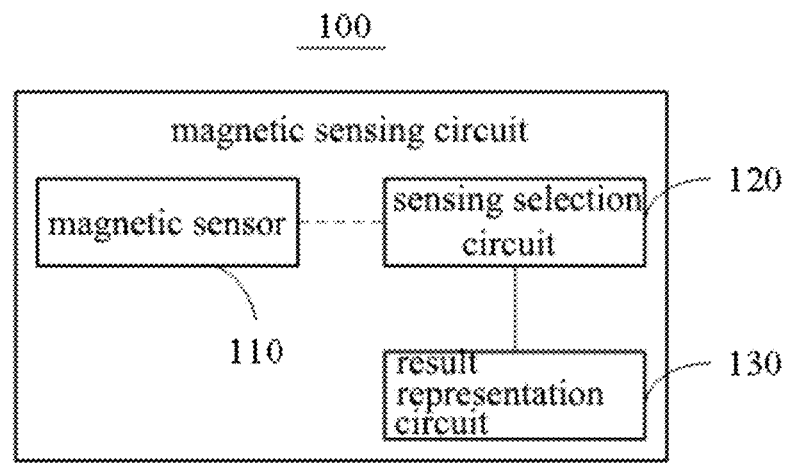
FIG. 4 is a schematic structural block diagram of a magnetic sensing circuit according to an embodiment of the present application.

Referring to FIG. 4, a magnetic sensing circuit 100 provided in the embodiments of the present application includes a magnetic sensor 110, a sensing selection circuit 120, and a result representation circuit 130. In the embodiments of the present application, the magnetic sensor 110 may be, but not limited to, magnetic sensors such as CC6201ST, CC6201TO, and QMC5883L-TR.

A plurality of magnetic sensors 110 are provided, and at least some magnetic sensors 110 in the plurality of magnetic sensors 110 are capable of being connected to the sensing selection circuit 120 by a sensing output terminal to send a magnetic sensing result to the sensing selection circuit 120. The sensing selection circuit 120 is configured to obtain a result representation signal according to the magnetic sensing result, and send the result representation signal to the result representation circuit 130. The result representation circuit 130 is configured to display a sensing notification according to the result representation signal. The magnetic sensing circuit 100 provided in the embodiments of the present application is implemented by using a magnetic sensor 110. The service life of the magnetic sensing circuit is not affected by factors such as an operating current, an environmental humidity, and a switching frequency. In addition, only one magnetic sensing circuit 100 may be arranged in one same electrical device, and then at least some magnetic sensors 110 are selected from a plurality of magnetic sensors 110 according to an actual sensing requirement to be connected to a sensing selection circuit 120 by a sensing output terminal to implement an application. Therefore, the design and development costs of the magnetic sensing circuit 100 are reduced, and eventually the manufacturing cost and maintenance cost of the electrical device are reduced.

Figure 5:
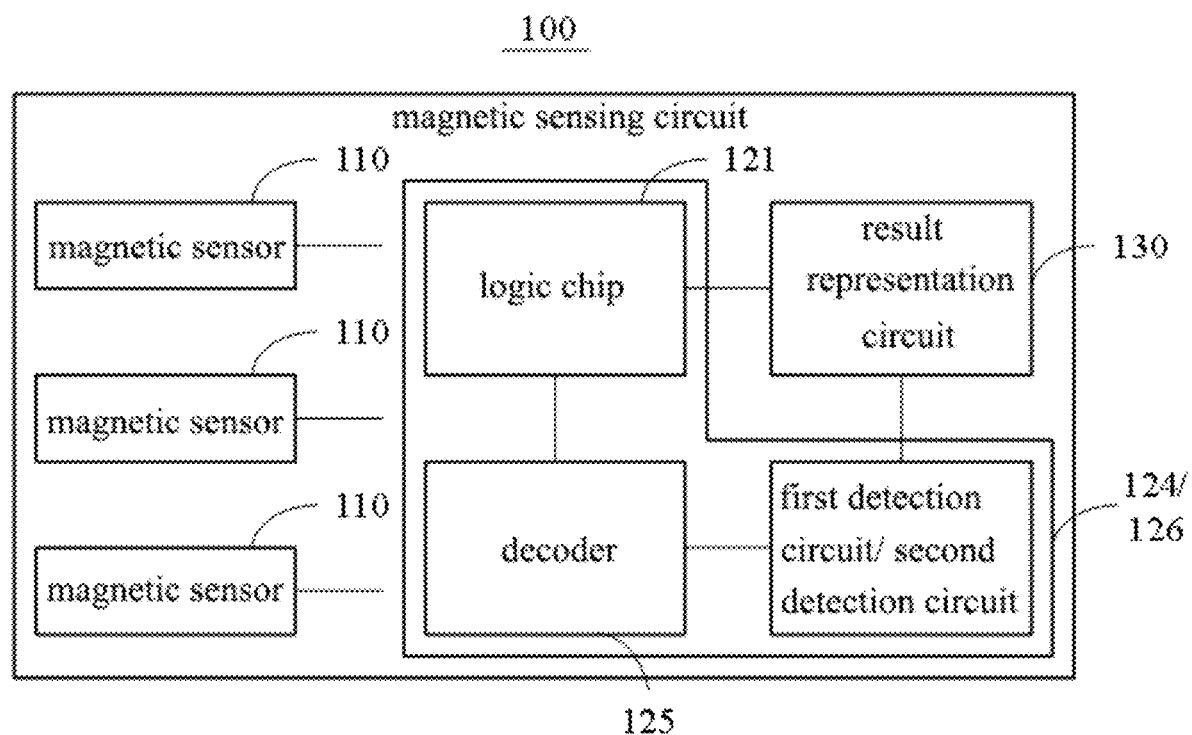
FIG. 5 is another schematic structural block diagram of a magnetic sensing circuit according to an embodiment of the present application.

In conjunction with FIG. 5, in the embodiments of the present application, in a first optional embodiment, the sensing selection circuit 120 includes a logic chip 121, at least some magnetic sensors 110 in the plurality of magnetic sensors 110 are capable of being connected to a signal input terminal of the logic chip 121 by the sensing output terminal, and a signal output terminal of the logic chip 121 is used as an output terminal of the sensing selection circuit 120 to be connected to an input terminal of the result representation circuit 130. In the embodiments of the present application, the logic chip 121 may be, but not limited to, an AND gate chip, an OR gate chip, a NOT gate chip, and a shift register. A quantity of signal input terminals of the AND gate chip is not limited. For example, the AND gate chip may include two signal input terminals, or may include three signal input terminals, or may include four signal input terminals. Similarly, a quantity of signal input terminals of the OR gate chip is not limited. For example, the OR gate chip may include two signal input terminals, or may include three signal input terminals, or may include four signal input terminals.

To further reduce the design and development costs of the magnetic sensing circuit 100, the sensing selection circuit 120 provided in the embodiments of the present application may further include a connecting resistor 122. Based on this, at least some magnetic sensors 110 in the plurality of magnetic sensors 110 are capable of being connected to a corresponding connecting resistor 122 by the sensing output terminal to be connected to the signal input terminal of the logic chip 121 by the corresponding connecting resistor 122. The connecting resistor 122 may use a resistor with a resistance less than 100Ω. Certainly, a 0-Ω resistor, that is, a jumper resistor, may be used.

Further, to improve the safety and service life of the magnetic sensing circuit 100, in the embodiments of the present application, the sensing selection circuit 120 may further include a current-limiting resistor R5. In this case, the signal output terminal of the logic chip 121 is connected to one end of the current-limiting resistor R5, and the other end of the current-limiting resistor R5 is used as an output terminal of the sensing selection circuit 120 to be connected to the input terminal of the result representation circuit 130. During actual implementation, the current-limiting resistor R5 may use a resistor with a resistance less than 100Ω.

In addition, in the embodiments of the present application, the sensing selection circuit 120 may further include a first detection circuit 124. A signal input terminal of the first detection circuit 124 is connected to the signal output terminal of the logic chip 121. In this case, a signal output terminal of the first detection circuit 124 is used as the output terminal of the sensing selection circuit 120 to be connected to the input terminal of the result representation circuit 130. The first detection circuit 124 may include an integrated circuit chip having a signal processing capability, for example, a microcontroller, and may be specifically, but not limited to, an STM8L051 chip and an STM32F010 chip. During actual implementation, the first detection circuit 124 may be connected to the signal output terminal of the logic chip 121 by one signal input terminal. Alternatively, the first detection circuit 124 may be connected in a one-to-one correspondence to signal output terminals of a plurality of logic chips 121 by a plurality of signal input terminals. The plurality of logic chips 121 may be chips of the same type or may be different chips. For example, the first detection circuit 124 may be connected to signal output terminals of two AND gate chips by two signal input terminals. The first detection circuit 124 may be connected to a signal output terminal of one AND gate chip by one signal input terminal and connected to a signal output terminal of one OR gate chip by another signal input terminal.

Corresponding to the embodiment in which the sensing selection circuit 120 includes the logic chip 121 but does not include the first detection circuit 124, in the embodiments of the present application, the result representation circuit 130 may include a switch device 131, a first driving circuit 132, and a first load 133. A control terminal of the switch device 131 is connected to the output terminal of the sensing selection circuit 120, and is configured to control an open/closed state by using the result representation signal, and when the switch device is in the closed state, a generated driving signal is sent to the first driving circuit 132. The first driving circuit 132 is configured to control the first load 133 under the control of the driving signal to start and run, such that the first load 133 can use a running result as the sensing notification. In the embodiments of the present application, the switch device 131 may be an N-channel metal-oxide-semiconductor field-effect transistor (MOSFET), referred to as an NMOS transistor. Certainly, the switch device 131 may be alternatively a triode. This is not specifically limited in the embodiments of the present application.

Corresponding to the embodiment in which the sensing selection circuit 120 includes the logic chip 121 and also includes the first detection circuit 124, in the embodiments of the present application, the result representation circuit 130 may include a display 134 and may further include a second driving circuit 135 and a second load 136.

If the result representation circuit 130 includes the display 134, the display 134 is connected to the output terminal of the sensing selection circuit 120. If the result representation circuit 130 includes the second driving circuit 135 and the second load 136, a control terminal of the second driving circuit 135 is connected to the output terminal of the sensing selection circuit 120, and is configured to control the second load 136 by using the result representation signal to start and run, such that the second load 136 can use a running result as the sensing notification.

To further reduce the design and development costs of the magnetic sensing circuit 100, in the embodiments of the present application, the first load 133 and the second load 136 may be the same load device, for example, may be a display device or may be an indicator light or another load device with an indication function. Based on this, in the embodiments of the present application, the first driving circuit 132 and the second driving circuit 135 may be the same driving circuit.

In the embodiments of the present application, in a second optional embodiment, the sensing selection circuit 120 may further include a decoder 125 and a second detection circuit 126. At least some magnetic sensors 110 in the plurality of magnetic sensors 110 can be connected to a signal input terminal of the decoder 125 by the sensing output terminal. A signal output terminal of the decoder 125 is connected to a signal input terminal of the second detection circuit 126. A signal output terminal of the second detection circuit 126 is used as an output terminal of the sensing selection circuit 120 to be connected to an input terminal of the result representation circuit 130. In the embodiments of the present application, the decoder 125 may be a 3 Input 8 output decoder, for example, a 74HC138 decoder. The second detection circuit 126 may include an integrated circuit chip having a signal processing capability, for example, a microcontroller, and may be specifically, but not limited to, an STM8L051 chip and an STM32F010 chip.

To further reduce the design and development costs of the magnetic sensing circuit 100, in the embodiments of the present application, the first detection circuit 124 and the second detection circuit 126 may be the same integrated circuit chip.

Corresponding to the second optional embodiment of the sensing selection circuit 120, in the embodiments of the present application, the result representation circuit 130 may include a display 134 and may further include a second driving circuit 135 and a second load 136.

If the result representation circuit 130 includes the display 134, the display 134 is connected to the output terminal of the sensing selection circuit 120. If the result representation circuit 130 includes the second driving circuit 135 and the second load 136, a control terminal of the second driving circuit 135 is connected to the output terminal of the sensing selection circuit 120, and is configured to control the second load 136 by using the result representation signal to start and run, such that the second load 136 can use a running result as the sensing notification.

Figure 6:
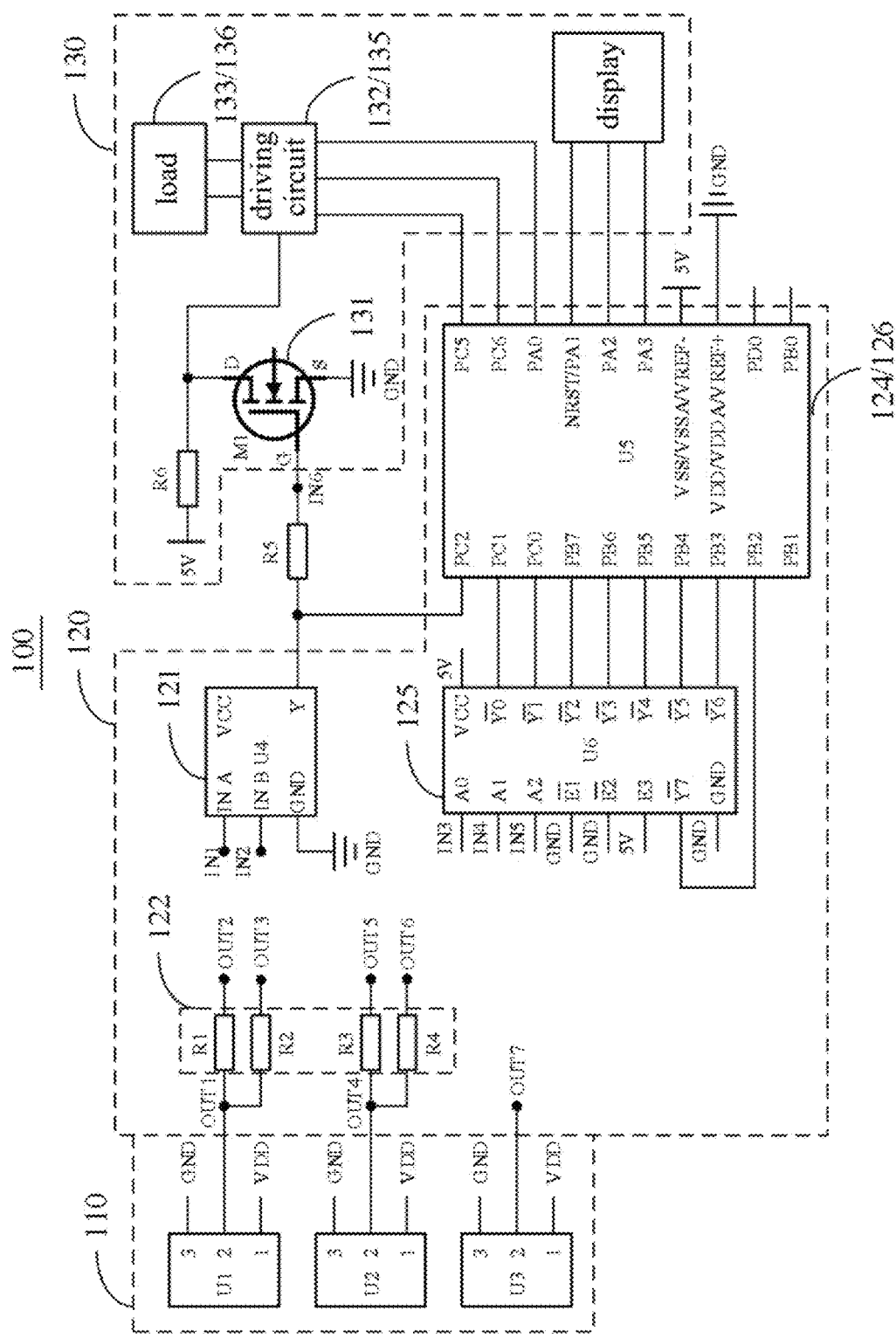
FIG. 6 is a schematic diagram of a circuit structure of a magnetic sensing circuit according to an embodiment of the present application (a magnetic sensor is not connected to a sensing selection circuit)

The operating principle of the magnetic sensing circuit 100 provided in the embodiments of the present application is described below with reference to FIG. 6.

Three magnetic sensors 110 are provided, which are represented as a first magnetic sensor U1, a second magnetic sensor U2, and a third magnetic sensor U3. The sensing selection circuit 120 includes one logic chip 121, which is specifically an AND gate chip U4. In addition, the sensing selection circuit 120 further includes four connecting resistors 122, a microcontroller U5 (the first detection circuit 124 and the second detection circuit 126) and a 3 input 8 output decoder U6. The four connecting resistors 122 are respectively represented as a first connecting resistor R1, a second connecting resistor R2, a third connecting resistor R3, and a fourth connecting resistor R4. The result representation circuit 130 includes an NMOS transistor M1, a driving circuit (the first driving circuit 132 and the second driving circuit 135), a load (the first load 133 and the second load 136), and a display 134.

A sensing output terminal of the first magnetic sensor U1 is denoted as OUT1, and is connected to one end of the first connecting resistor R1, and the other end of the first connecting resistor R1 is denoted as a first selection connection terminal OUT2. In addition, the sensing output terminal OUT1 of the first magnetic sensor U1 is further connected to one end of the second connecting resistor R2, and the other end of the second connecting resistor R2 is denoted as a second selection connection terminal OUT3.

A sensing output terminal of the second magnetic sensor U2 is denoted as OUT4, and is connected to one end of the third connecting resistor R3, and the other end of the third connecting resistor R3 is denoted as a third selection connection terminal OUT5. In addition, the sensing output terminal OUT4 of the second magnetic sensor U2 is further connected to one end of the fourth connecting resistor R4, and the other end of the fourth connecting resistor R4 is denoted as a fourth selection connection terminal OUT6.

A sensing output terminal of the third magnetic sensor U3 is denoted as OUT7.

A first signal input terminal of the AND gate U4 is denoted as IN1, and a second signal input terminal is denoted as IN2. A signal output terminal of the AND gate chip U4 is connected to the current-limiting resistor R5 and the NMOS transistor M1, a source of the NMOS transistor M1 is grounded, and a drain is connected to a power supply by a control resistor R6 and is also connected to a first control terminal of the driving circuit. In addition, a signal output terminal of the AND gate chip U4 is further connected to a first signal input terminal PC2 of the microcontroller U5.

A first signal input terminal of the 3 input 8 output decoder U6 is denoted as IN3, a second signal input terminal is denoted as IN4, a third signal input terminal is denoted as IN5, and eight signal output terminals of the 3 input 8 output decoder U6 are connected in a one-to-one correspondence to eight signal input terminals of the microcontroller U5.

Three signal output terminals of the microcontroller U5 are connected to a second control terminal of the driving circuit and three other signal output terminals are connected to the display 134.

During actual application of the magnetic sensing circuit 100 provided in the embodiments of the present application, specifically, some magnetic sensors 110 in the plurality of magnetic sensors 110 are selected to be connected to the sensing selection circuit 120. A specific manner of connecting the sensing selection circuit 120 may be determined according to an actual sensing requirement. For example, in FIG. 6, the first selection connection terminal OUT2 may be connected to the first signal input terminal IN1 on the AND gate chip U4. In addition, the third selection connection terminal OUT5 is connected to the second signal input terminal IN2 on the AND gate chip U4, and then the sensing output terminal OUT1 of the first magnetic sensor U1, the sensing output terminal OUT4 of the second magnetic sensor U2, and the sensing output terminal OUT7 of the third magnetic sensor U3 are respectively connected to the first signal input terminal IN3, the second signal input terminal IN4, and the third signal input terminal IN5 of the 3 input 8 output decoder U6, to eventually form the magnetic sensing circuit 100 shown in FIG. 7.

Figure 7:
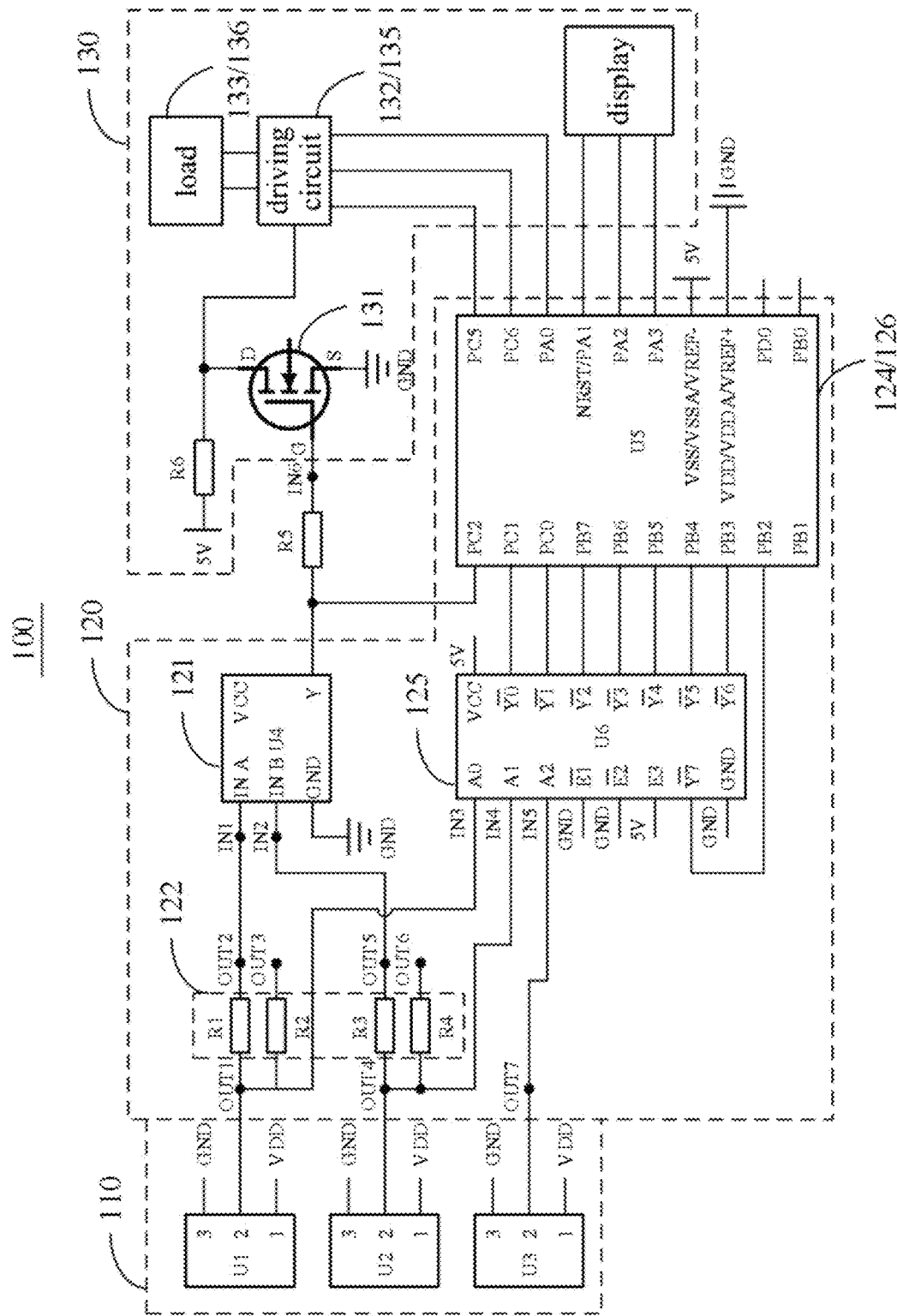
FIG. 7 is a schematic diagram of another circuit structure of a magnetic sensing circuit according to an embodiment of the present application (a magnetic sensor is connected to a sensing selection circuit)

Based on the magnetic sensing circuit 100 shown in FIG. 7, if the first magnetic sensor U1 and the second magnetic sensor U2 simultaneously detect a magnetic member, the sensing output terminal of the first magnetic sensor U1 outputs a high-level signal, and the sensing output terminal of the second magnetic sensor U2 outputs a high-level signal. In this case, the signal output terminal of the AND gate U4 also outputs a high-level signal, to connect the source and drain of the NMOS transistor M1, a level signal on a drain side is pulled down and used as a driving signal to enable the driving circuit to control a load to start and run, such that the load can use a running result as a sensing notification. In contrast, if either of the first magnetic sensor U1 and the second magnetic sensor U2 fails to detect a magnetic member, the load is not started and run.

A combination of the 3 input 8 output decoder U6 and the microcontroller U5 can further obtain a detection result of each magnetic sensor 110 in the first magnetic sensor U1, the second magnetic sensor U2, and the third magnetic sensor U3, and display the detection result by using the display 134. The process mainly implements control according to a program language burnt in advance in the microcontroller U5.

Finally, the application scenario of the magnetic sensing circuit 100 provided in the embodiments of the present application is described below with reference to FIG. 8.

When the magnetic sensing circuit provided in the embodiments of the present application is applied to a specific electrical device, for example, an air purifier 200, it is assumed that an actual sensing requirement is to detect whether a filter 210 and a collector 220 are successfully installed. As shown in FIG. 8, the first magnetic sensor U1 of the magnetic sensing circuit 100 shown in FIG. 6 may be installed on a main part 230 of the air purifier 200 at a position corresponding to the filter 210. The second magnetic sensor U2 of the magnetic sensing circuit 100 shown in FIG. 6 is installed on the main part 230 of the air purifier 200 at a position corresponding to the collector 220. In addition, one magnetic member is disposed on an installation surface of the filter 210 (the side of the filter 210 close to the main part 230). Another magnetic member is disposed on an installation surface of the collector 220 (the side of the collector 220 close to the main part 230). In this case, a manner in which the first magnetic sensor U1 and the second magnetic sensor U2 of the magnetic sensing circuit 100 shown in FIG. 6 are connected to the sensing selection circuit 120 may be shown in FIG. 9. The third magnetic sensor U3 is not connected to the sensing selection circuit 120.

Figure 8:
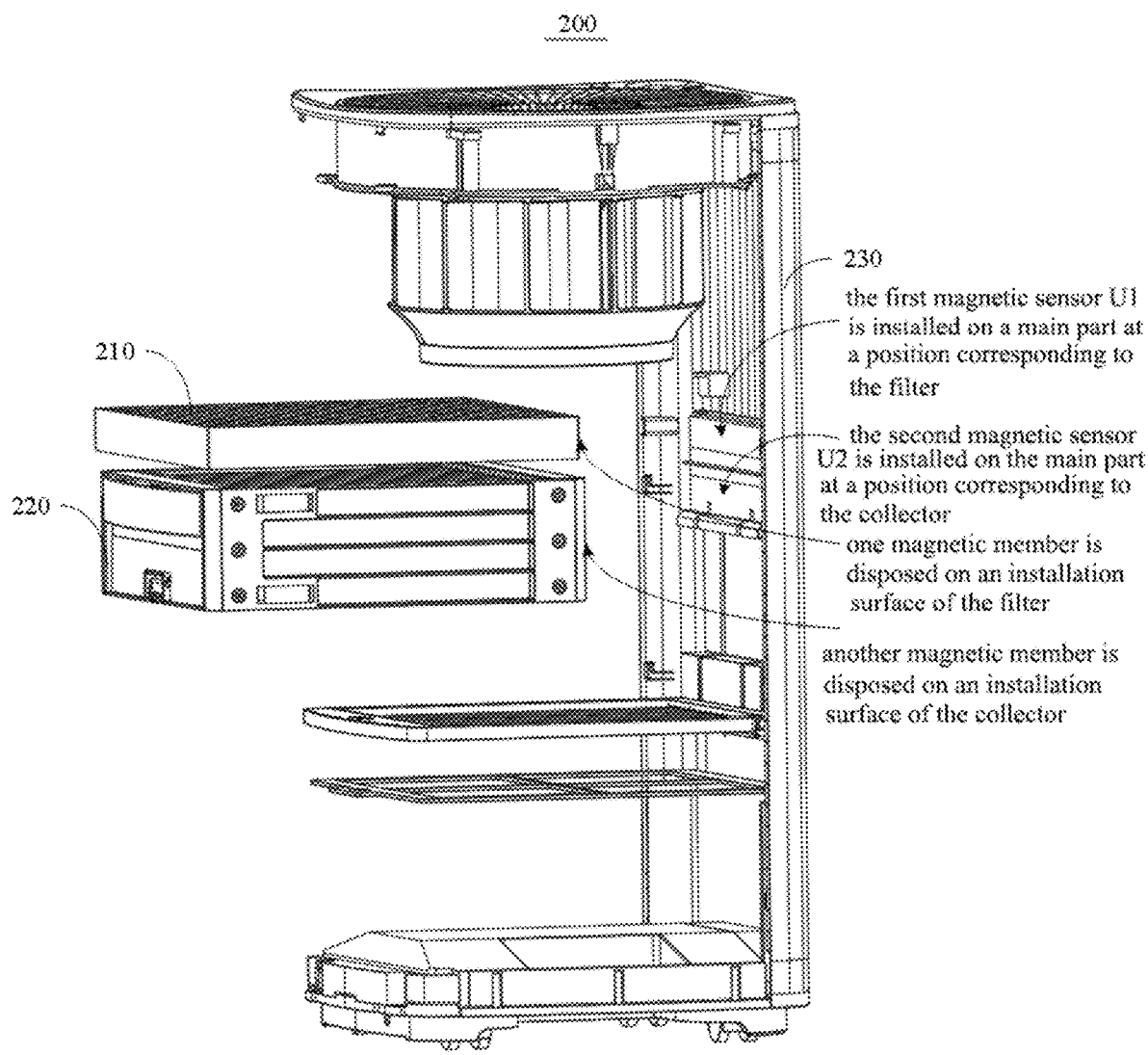
FIG. 8 is a schematic diagram of an application scenario of a magnetic sensing circuit according to an embodiment of the present application.
Figure 9:
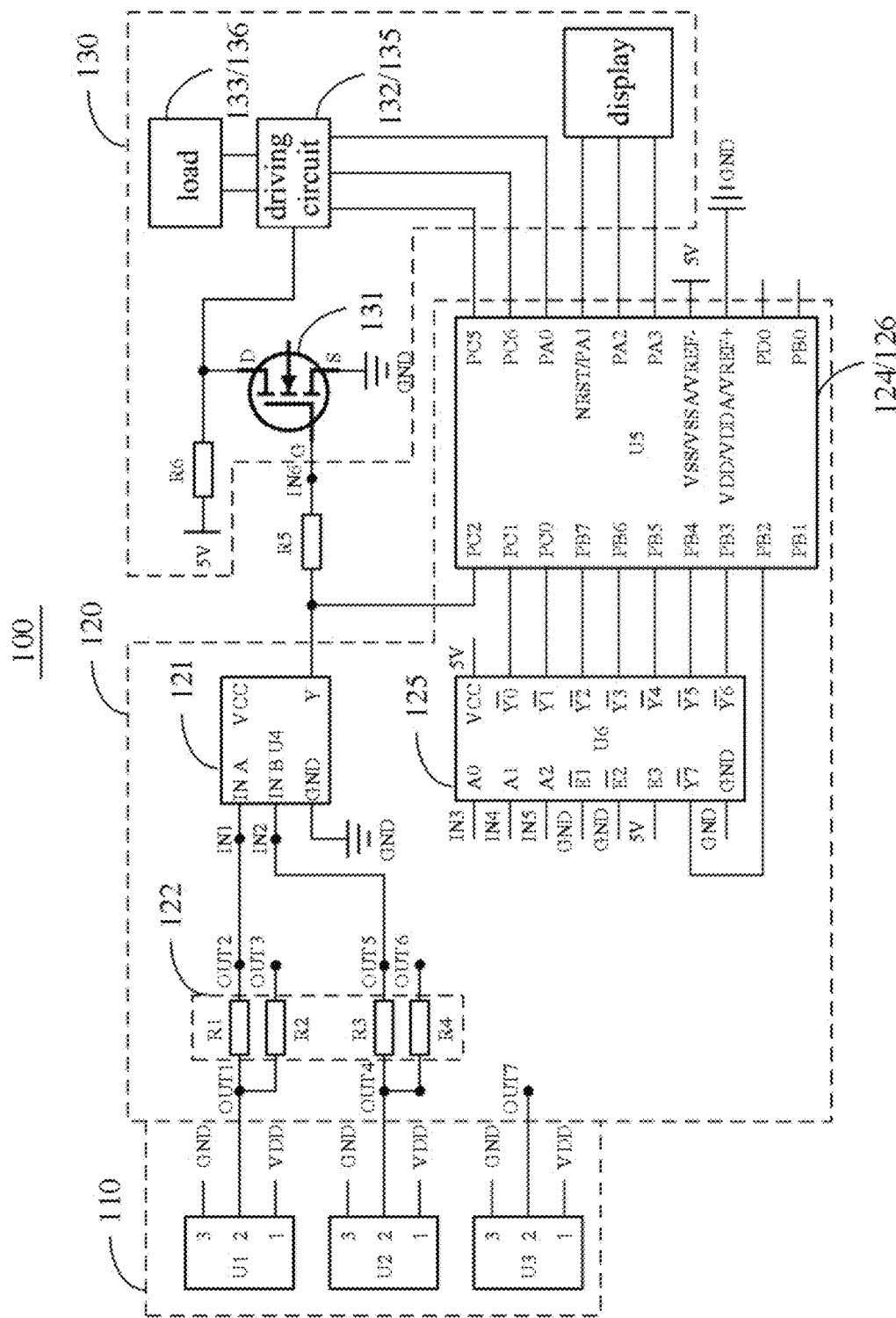
FIG. 9 is a schematic diagram of another circuit structure of a magnetic sensing circuit according to an embodiment of the present application (a magnetic sensor is connected to a sensing selection circuit).

With reference to the schematic diagram of the application scenario in FIG. 8 and the magnetic sensing circuit 100 shown in FIG. 9, a load is started and run only when the first magnetic sensor U1 and the second magnetic sensor U2 simultaneously detect a magnetic member, and a running result is used as a sensing notification. In contrast, if either of the first magnetic sensor U1 and the second magnetic sensor U2 fails to detect a magnetic member, the load is not started and run.

The embodiments of the present application further provide an electrical device, including the foregoing magnetic sensing circuit 100. The electrical device provided in the embodiments of the present application may be, but not limited to, a computer, an automobile, an induction cooker, a microwave oven, a household appliance, and a power tool. The household appliance may be an air purifier.

In summary, the magnetic sensing circuit 100 provided in the embodiments of the present application includes a magnetic sensor 110, a sensing selection circuit 120, and a result representation circuit 130. A plurality of magnetic sensors 100 are provided, and at least some magnetic sensors 110 in the plurality of magnetic sensors 110 are capable of being connected to the sensing selection circuit 120 by a sensing output terminal to send a magnetic sensing result to the sensing selection circuit 120. The sensing selection circuit 120 is configured to obtain a result representation signal according to the magnetic sensing result, and send the result representation signal to the result representation circuit 130. The result representation circuit 130 is configured to display a sensing notification according to the result representation signal. The magnetic sensing circuit 100 provided in the embodiments of the present application is implemented by using a magnetic sensor 110. The service life of the magnetic sensing circuit is not affected by factors such as an operating current, an environmental humidity, and a switching frequency. In addition, only one magnetic sensing circuit 100 may be arranged in one same electrical device, and then at least some magnetic sensors 110 are selected from a plurality of magnetic sensors 110 according to an actual sensing requirement to be connected to a sensing selection circuit 120 by a sensing output terminal to implement an application. Therefore, the design and development costs of the magnetic sensing circuit 100 are reduced, and eventually the manufacturing cost and maintenance cost of the electrical device are reduced.

Further, in the magnetic sensing circuit 100 provided in the embodiments of the present application, the sensing selection circuit 120 can be arranged in many manners and can adapt to different sensing requirements, thereby improving the compatibility and applicable range of the magnetic sensing circuit 100.

The electrical device provided in the embodiments of the present application has the same beneficial effects as the foregoing magnetic sensing circuit. Details are not described herein.

In the description of the present application, it needs to be noted that unless otherwise expressly specified and defined, the terms "connected" and "provided" should be understood in a broad sense, for example, mechanically fixedly connected, detachably connected or integrally connected; or electrically connected or communicatively connected, where the "communicatively connected" may be communicatively connected in a wired or wireless manner; or connected directly or indirectly through an intermediate, or two elements communicated internally. For a person skilled in the art, specific meanings of the terms in the present application should be understood according to specific conditions. In addition, the terms such as "first", "second", and "third" are used only for distinguishing between descriptions, but are not intended to indicate or imply relative importance.

Although the embodiments of the present invention are described in conjunction with the accompanying drawings, various modifications and variations may be made by those skilled in the art without departing from the spirit and scope of the present invention, and such modifications and variations fall within the scope defined by the appended claims.

What is claimed is:

1. A driving circuit, comprising:
  a segment display, comprising a plurality of light-emitting units;
  a controller, configured to generate a control instruction for the segment display according to a configuration signal;
  a digital driver, connected to the controller, and configured to generate a pulse driving signal according to the control instruction generated by the controller; and
  an amplification circuit, with one end being connected to the digital driver and the other end being connected to the plurality of light-emitting units of the segment display, and configured to amplify the pulse driving signal, wherein the amplified pulse driving signal is used for driving the light-emitting units of the segment display to emit light,
  wherein there are a plurality of segment displays, and each segment display comprises a plurality of light-emitting units,
  wherein driving circuit further comprises:
    a gating circuit, comprising a plurality of gating switches, wherein one end of each gating switch is connected to the digital driver, and the other end is connected to one segment display,
  wherein the control instruction further comprises a gating instruction, and the digital driver is further configured to generate a gating pulse signal according to the gating instruction, to drive a target gating switch of a selected target segment display to be turned on, and
  wherein the gating switch comprises:
    a first triode and a second triode, wherein the first triode is connected to the digital driver, and the second triode is connected to one segment display; and
    a first noise reduction circuit, connected between the first triode and the second triode, and configured to reduce a noise signal of the gating switch.

2. The driving circuit according to claim 1, wherein the amplification circuit comprises a plurality of amplifiers, wherein one end of each amplifier is connected to the digital driver, and the other end is connected to one light-emitting unit of the target segment display.

3. The driving circuit according to claim 2, wherein the amplifier comprises:
  a third triode and a fourth triode, wherein the third triode is connected to the digital driver, and the fourth triode is connected to one light-emitting unit of the target segment display; and
  a second noise reduction circuit, connected between the third triode and the fourth triode, and configured to reduce a noise signal of the amplifier.

4. The driving circuit according to claim 2, further comprising:
  a shunt circuit, comprising a plurality of shunt resistors, wherein one end of each shunt resistor is connected to one amplifier, and the other end is connected to one light-emitting unit of the target segment display.

5. The driving circuit according to claim 1, further comprising:
  a third noise reduction circuit, connected between the digital driver and the gating circuit, and configured to reduce a noise signal of the gating circuit.

6. The driving circuit according to claim 2, further comprising:
  a fourth noise reduction circuit, connected between the digital driver and the amplifier, and configured to reduce a noise signal of the amplifier.

7. A magnetic sensing circuit, comprising a magnetic sensor, a sensing selection circuit, and a result representation circuit, wherein a plurality of magnetic sensors are provided, and at least some magnetic sensors in the plurality of magnetic sensors are capable of being connected to the sensing selection circuit by a sensing output terminal to send a magnetic sensing result to the sensing selection circuit;

the sensing selection circuit is configured to obtain a result representation signal according to the magnetic sensing result, and send the result representation signal to the result representation circuit; and the result representation circuit is configured to display a sensing notification according to the result representation signal, wherein the sensing selection circuit comprises a logic chip, at least some magnetic sensors in the plurality of magnetic sensors are capable of being connected to a signal input terminal of the logic chip by the sensing output terminal, and a signal output terminal of the logic chip is used as an output terminal of the sensing selection circuit to be connected to an input terminal of the result representation circuit.

8. The magnetic sensing circuit according to claim 7, wherein the sensing selection circuit further comprises a connecting resistor, and at least some magnetic sensors in the plurality of magnetic sensors are capable of being connected to a corresponding connecting resistor by the sensing output terminal to be connected to the signal input terminal of the logic chip by the corresponding connecting resistor.

9. The magnetic sensing circuit according to claim 7, wherein the sensing selection circuit further comprises a current-limiting resistor, the signal output terminal of the logic chip is connected to one end of the current-limiting resistor, and the other end of the current-limiting resistor is used as the output terminal of the sensing selection circuit to be connected to the input terminal of the result representation circuit.

10. The magnetic sensing circuit according to claim 7, wherein the result representation circuit comprises a switch device, a first driving circuit, and a first load;

a control terminal of the switch device is connected to the output terminal of the sensing selection circuit, and is configured to control an open/closed state by using the result representation signal, and when the switch device is in the closed state, a generated driving signal is sent to the first driving circuit; and the first driving circuit is configured to control the first load under the control of the driving signal to start and run, so that the first load can use a running result as the sensing notification.

11. The magnetic sensing circuit according to claim 7, wherein the sensing selection circuit further comprises a first detection circuit, a signal input terminal of the first detection circuit is connected to the signal output terminal of the logic chip, and a signal output terminal of the first detection circuit is used as the output terminal of the sensing selection circuit to be connected to the input terminal of the result representation circuit.

12. The magnetic sensing circuit according to claim 7, wherein the sensing selection circuit comprises a decoder and a second detection circuit;

at least some magnetic sensors in the plurality of magnetic sensors are capable of being connected to a signal input terminal of the decoder by the sensing output terminal, and a signal output terminal of the decoder is connected to a signal input terminal of the second detection circuit; and a signal output terminal of the second detection circuit is used as an output terminal of the sensing selection circuit to be connected to an input terminal of the result representation circuit.

13. The magnetic sensing circuit according to claim 11, wherein the result representation circuit comprises a display, and the display is connected to the output terminal of the sensing selection circuit.

14. The magnetic sensing circuit according to claim 11, wherein the result representation circuit comprises a second driving circuit and a second load; and a control terminal of the second driving circuit is connected to the output terminal of the sensing selection circuit, and is configured to control the second load by using the result representation signal to start and run, so that the second load can use a running result as the sensing notification.

15. An electrical device, comprising the magnetic sensing circuit according to claim 7.

\* \* \* \* \*